United States Patent
Kang et al.

(10) Patent No.: US 8,049,543 B2
(45) Date of Patent: Nov. 1, 2011

(54) DELAY LOCKED LOOP, ELECTRONIC DEVICE INCLUDING THE SAME, AND METHOD OF OPERATING THE SAME

(75) Inventors: Hee Chai Kang, Namwon-si (KR); Kyeong Ho Ryu, Seoul (KR); Seong Ook Jung, Goyang-si (KR); Won Lee, Gunpo-si (KR); Dong Hwan Lee, Seongnam-si (KR); Alex Joo, Yongin-si (KR); Jong-Ryun Choi, Hwasung-si (KR)

(73) Assignees: Samsung Electronics Co., Ltd. (KR); Industry-Academic Cooperation Foundation, Yonsei University (KR)

( * ) Notice: Subject to any disclaimer, the term of this patent is extended or adjusted under 35 U.S.C. 154(b) by 217 days.

(21) Appl. No.: 12/592,753

(22) Filed: Dec. 2, 2009

(65) Prior Publication Data

US 2010/0194456 A1  Aug. 5, 2010

(30) Foreign Application Priority Data

Feb. 4, 2009  (KR) .................. 10-2009-0008897

(51) Int. Cl.
 *H03L 7/06* (2006.01)
(52) U.S. Cl. ....................................... 327/158; 327/149
(58) Field of Classification Search .................. 327/149, 327/158
 See application file for complete search history.

(56) References Cited

U.S. PATENT DOCUMENTS

| | | | |
|---|---|---|---|
| 7,292,079 B2 | 11/2007 | Huang et al. | |
| 7,372,310 B2 | 5/2008 | Lee | |
| 7,605,625 B2 * | 10/2009 | Pellerano et al. | 327/158 |
| 2007/0176656 A1 * | 8/2007 | Lesso | 327/158 |
| 2007/0210842 A1 * | 9/2007 | Kawamoto | 327/158 |
| 2008/0025451 A1 * | 1/2008 | Kim et al. | 375/364 |
| 2008/0042698 A1 * | 2/2008 | Kim | 327/116 |
| 2008/0049878 A1 * | 2/2008 | Stoica et al. | 375/354 |
| 2008/0089459 A1 * | 4/2008 | Vlasenko et al. | 375/376 |
| 2008/0100357 A1 | 5/2008 | Bae | |
| 2008/0297210 A1 * | 12/2008 | Kim | 327/116 |
| 2009/0091362 A1 * | 4/2009 | Pellerano et al. | 327/158 |
| 2009/0134924 A1 * | 5/2009 | Kawamoto | 327/158 |
| 2009/0168942 A1 * | 7/2009 | Choi et al. | 375/373 |
| 2009/0189652 A1 * | 7/2009 | Kim et al. | 327/116 |
| 2009/0302906 A1 * | 12/2009 | Rhee et al. | 327/156 |
| 2010/0156488 A1 * | 6/2010 | Kim et al. | 327/158 |
| 2010/0194456 A1 * | 8/2010 | Kang et al. | 327/158 |
| 2011/0128171 A1 * | 6/2011 | Oshima et al. | 341/120 |

FOREIGN PATENT DOCUMENTS

| | | | |
|---|---|---|---|
| KR | 10-2007-0036549 A | 4/2007 | |
| KR | 10-2008-0038517 A | 5/2008 | |

* cited by examiner

*Primary Examiner* — Lincoln Donovan
*Assistant Examiner* — Adam Houston
(74) *Attorney, Agent, or Firm* — Onello & Mello LLP

(57) ABSTRACT

A delay locked loop controls a plurality of delay blocks included in a delay line and thus generate a plurality of clock signals which have a frequency obtained by multiplying a frequency of a reference clock signal, an accurate phase delay, and a constant duty cycle. The delay locked loop calculates an initial delay value and applies it to the delay blocks, thereby preventing harmonic locking and reducing locking time.

17 Claims, 10 Drawing Sheets

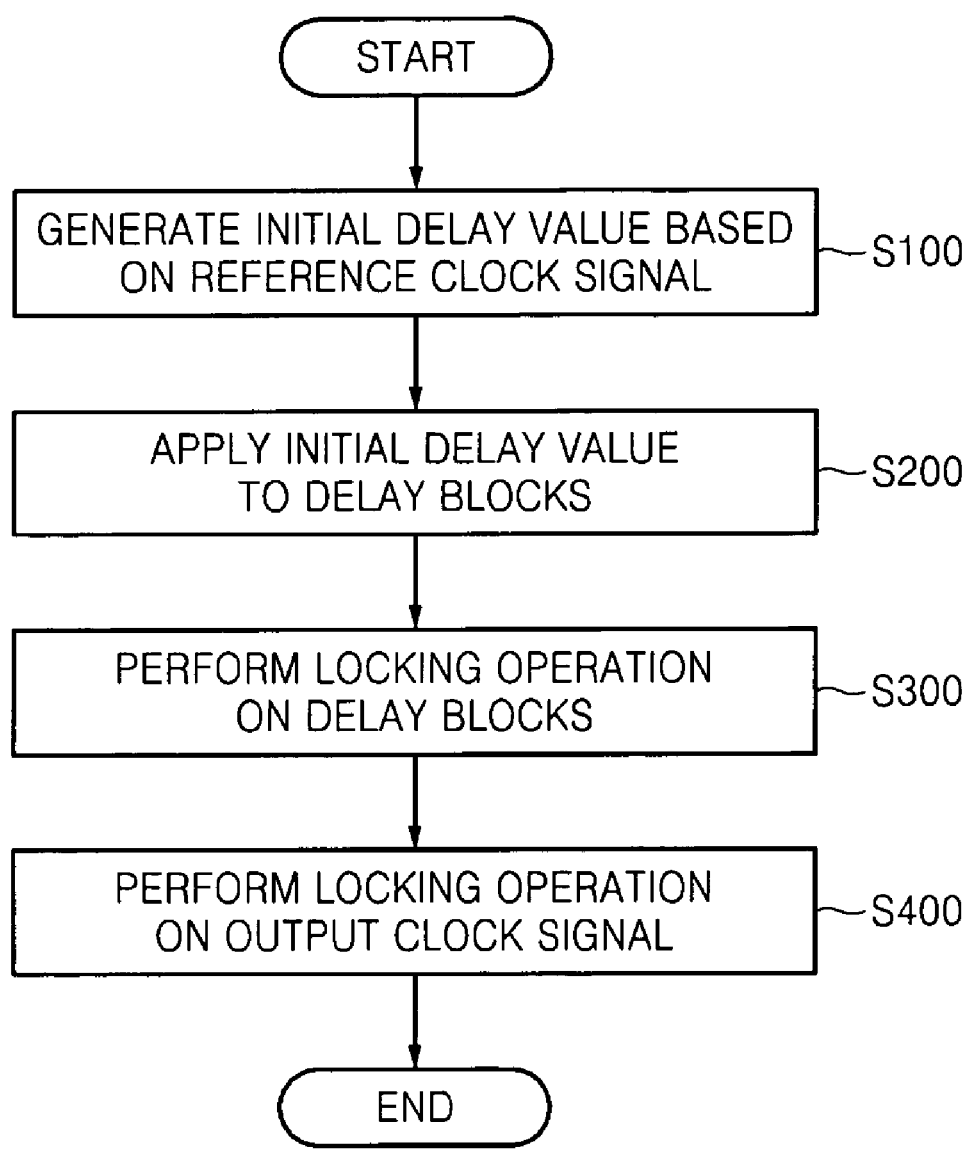

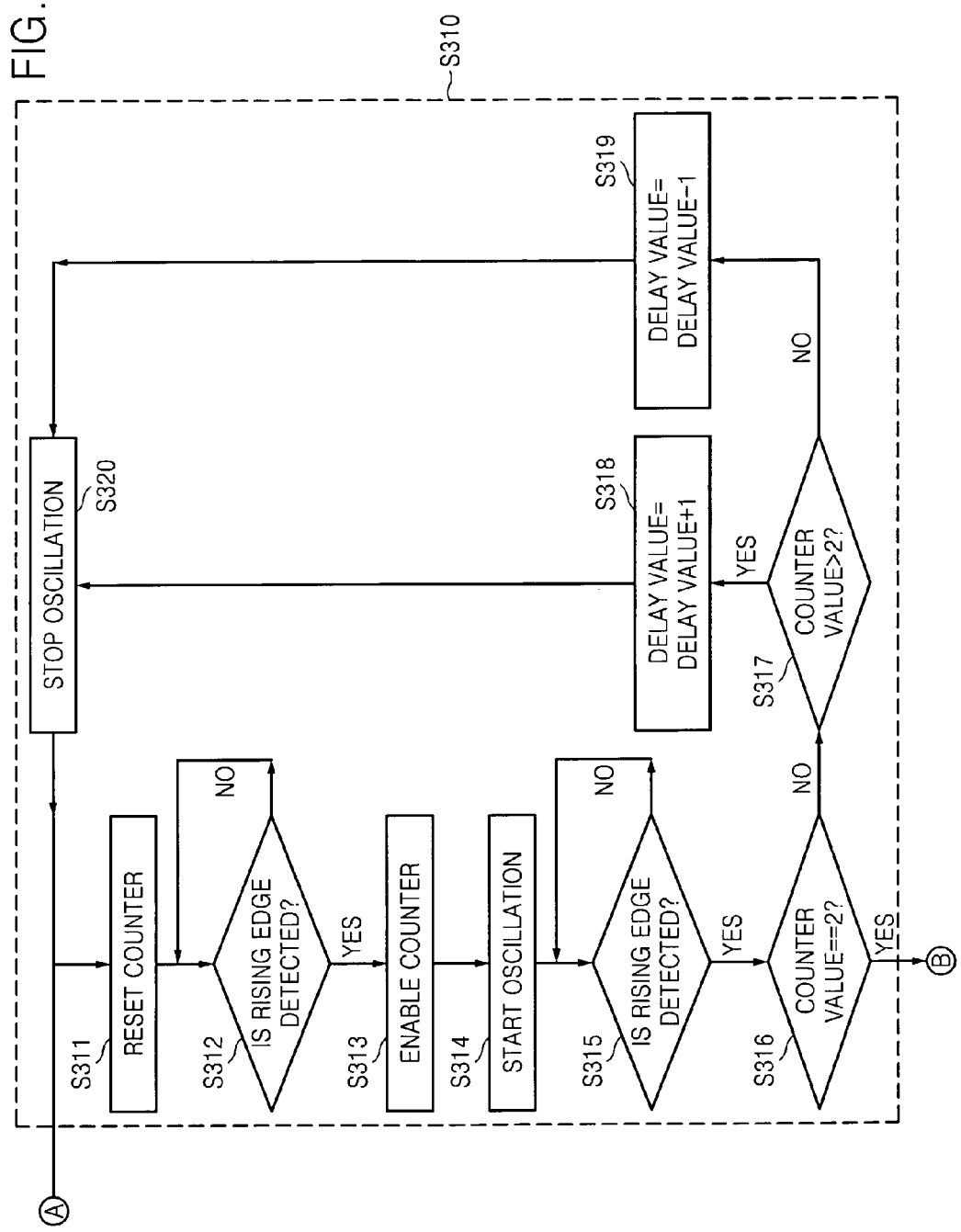

DELAY LOCKED LOOP, ELECTRONIC DEVICE INCLUDING THE SAME, AND METHOD OF OPERATING THE SAME

CROSS-REFERENCE TO RELATED APPLICATIONS

This application claims priority under 35 U.S.C. §119 to Korean Patent Application No. 10-2009-0008897 filed on Feb. 4, 2009, in the Korean Intellectual Property, the entire contents of which are incorporated herein by reference.

BACKGROUND

The present inventive concept relates to a delay locked loop (DLL), and more particularly, to a DLL for generating a clock signal having a frequency obtained by multiplying the frequency of a reference clock signal, and having an accurate phase delay and a constant duty cycle by compensating for an error occurring due to process variation.

A DLL may be used to generate an internal clock signal in electronic devices. The DLL usually delays an external clock signal by a predetermined period of time using a delay line and generates an internal clock signal synchronized with the external clock signal. The DLL may be used to generate a timing signal for the operation of a semiconductor memory device, e.g., dynamic random access memory (DRAM), that is, a signal used to read data from the semiconductor memory device or write data thereto.

To increase the data transmission speed between electronic devices, it is necessary to increase the frequency of an internal clock signal of the electronic devices. To decrease errors occurring in high-speed data transmission, a data valid window needs to be accurately positioned. For instance, when an internal clock signal having a frequency obtained by multiplying the frequency of an external clock signal is used in a semiconductor memory device, the data transmission speed of the semiconductor memory device can be increased. In addition, errors in high-speed data transmission can be reduced when clock signals having an accurate phase delay and an accurate duty cycle are used.

When the frequency of the internal clock signal increases, however, harmonic locking may occur during the locking operation of the DLL. Also, the influence of process variation is increasing with the microminiaturization of manufacturing technology. Accordingly, it is increasingly difficult to generate a clock signal having an accurate phase delay and a constant duty cycle due to phase delay mismatch between delay lines of the DLL.

SUMMARY

Some embodiments of the present inventive concept provide a delay locked loop (DLL) for generating a clock signal with a frequency obtained by multiplying a frequency of an external clock signal, an accurate phase delay, and a constant duty cycle and for preventing harmonic locking, and an electronic device including the same.

According to one aspect, the present inventive concept is directed to a delay locked loop including a delay line, an edge combiner, a fine tuning block, and a mode control block. The delay line includes a plurality of delay blocks each operating as a ring oscillator, which delays a reference clock signal by a predetermined phase, in response to a mode control signal and an initial delay value and operating as a phase delay line, which controls a phase of the reference clock signal or a phase of a signal output from a previous delay block among the plurality of delay blocks, in response to the mode control signal. The edge combiner generates an output clock signal having a constant duty cycle and a higher frequency than the reference clock signal in response to output signals of the delay blocks. The fine tuning block controls the delay blocks based on a phase difference between the reference clock signal and the output clock signal to control a locking operation on the output clock signal. The mode control block generates the mode control signal and the initial delay value based on the reference clock signal and whether each of the delay blocks has delayed the reference clock signal by the predetermined phase.

The mode control block may include a ring oscillator, an edge counter, and a mode controller. The ring oscillator oscillates in response to the reference clock signal. The edge counter generates the initial delay value based on a result of counting first edges of an output signal of the ring oscillator during one period of the reference clock signal. The mode controller generates the mode control signal based on whether each of the delay blocks has delayed the reference clock signal by the predetermined phase. The mode control block may also include a detector. The detector detects a predetermined period of the reference clock signal and controls an operation period of the ring oscillator based on the detected period of the reference clock signal.

Each of the delay blocks may include a selector, a phase delay unit block, a logic gate, a phase detector, an edge counter, and a delay line controller. The selector selectively outputs the reference clock signal or a feedback signal, which is an output signal of a current delay block among the plurality of delay blocks, or selectively outputs an output signal of the previous delay block or the feedback signal, based on the mode control signal. The phase delay unit block includes a plurality of phase delay units connected in series and driven in response to a phase control signal. The logic gate performs a logic operation on the mode control signal and an output signal of the phase delay unit block to generate an output signal of the delay block. The phase detector detects and outputs a phase difference between the output signal of the phase delay unit block and the reference clock signal. The edge counter counts the number of toggles of the output signal of the phase delay unit block during one period of the reference clock signal and outputs a counter value. The delay line controller generates the phase control signal in response to the mode control signal, the initial delay value, an output signal of the phase detector, an output signal of the edge counter, and an output signal of the fine tuning block.

The delay line controller may generate the phase control signal based on the mode control signal, the initial delay value, and the counter value of the edge counter when the delay line operates as a ring oscillator and may generate the phase control signal based on the mode control signal and the output signal of the phase detector when the delay line operates as a phase delay line.

Each of the delay blocks may further include a code converter converting the phase control signal output from the delay line controller into a code for controlling an operation of each of the phase delay units.

The edge combiner may detect an edge of an output signal of each of the delay blocks after each delay block completes delaying the reference clock signal and generate the output clock signal having the frequency higher than that of the reference clock signal based on detected edges of the output signals of the delay blocks.

The fine tuning block may operate when the delay line operates as the phase delay line and may include a phase detector and a fine tune controller. The phase detector detects and outputs the phase difference between the reference clock signal and the output clock signal. The fine tune controller outputs to the delay line controller a signal for controlling the phase delay units in each delay block based on the phase difference between the reference clock signal and the output clock signal.

According to another aspect, the inventive concept is directed to a delay locked loop. The delay locked loop includes a delay line, an edge combiner, a fine tuning block, and a mode control block. The delay line includes four delay blocks each configured to operate as a ring oscillator, which delays a phase of a reference clock signal by 90 degrees, in response to a mode control signal and an initial delay value and to operate as a phase delay line, which controls the phase of the reference clock signal or a phase of a signal output from a previous delay block among the four delay blocks, in response to the mode control signal. The edge combiner generates an output clock signal having a duty cycle of 50% and a frequency two times higher than a frequency of the reference clock signal in response to output signals of the four delay blocks. The fine tuning block controls the delay blocks based on a phase difference between the reference clock signal and the output clock signal to control a locking operation on the output clock signal. The mode control block generates the mode control signal and the initial delay value based on the reference clock signal and whether each of the delay blocks has delayed the phase of the reference clock signal by 90 degrees.

According to another aspect, the inventive concept is directed to an electronic device that includes the delay locked loop according to any of the embodiments of the inventive concept.

The delay locked loop of the inventive concept may be used in various types of electronic devices which use a clock signal generated based on a system clock signal or an external clock signal as a driving signal.

According to an exemplary embodiment of the present inventive concept, a method of operating a delay locked loop includes delaying a reference clock signal by a predetermined phase, in response to a mode control signal and an initial delay value, using a delay line comprising a plurality of delay blocks each configured to operate as a ring oscillator or controlling a phase of the reference clock signal or a phase of a signal output from a previous delay block among the plurality of delay blocks, in response to the mode control signal, using the delay blocks each configured to operate as a phase delay line, generating an output clock signal having a constant duty cycle and a higher frequency than the reference clock signal in response to output signals of the delay blocks using a edge combiner, controlling the delay blocks based on a phase difference between the reference clock signal and the output clock signal to control a locking operation on the output clock signal using a fine tuning block, and generating the mode control signal and the initial delay value based on the reference clock signal and whether each of the delay blocks has delayed the reference clock signal by the predetermined phase using a mode control block.

According to an exemplary embodiment of the present inventive concept, a computer readable medium stores a computer program to perform method steps for execution by a processor to operate a delay locked loop, the method comprising delaying a reference clock signal by a predetermined phase, in response to a mode control signal and an initial delay value, using a delay line comprising a plurality of delay blocks each configured to operate as a ring oscillator or controlling a phase of the reference clock signal or a phase of a signal output from a previous delay block among the plurality of delay blocks, in response to the mode control signal, using the delay blocks each configured to operate as a phase delay line, generating an output clock signal having a constant duty cycle and a higher frequency than the reference clock signal in response to output signals of the delay blocks using a edge combiner, controlling the delay blocks based on a phase difference between the reference clock signal and the output clock signal to control a locking operation on the output clock signal using a fine tuning block, and generating the mode control signal and the initial delay value based on the reference clock signal and whether each of the delay blocks has delayed the reference clock signal by the predetermined phase using a mode control block.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept.

FIG. 3 is a flowchart of a method of operating a DLL according to some embodiments of the present inventive concept.

FIGS. 4A through 4D contain a detailed flowchart of a method of operating the DLL having a frequency which is double a frequency of a reference clock signal in FIG. 2.

DETAILED DESCRIPTION OF THE EMBODIMENTS

Figure 1:
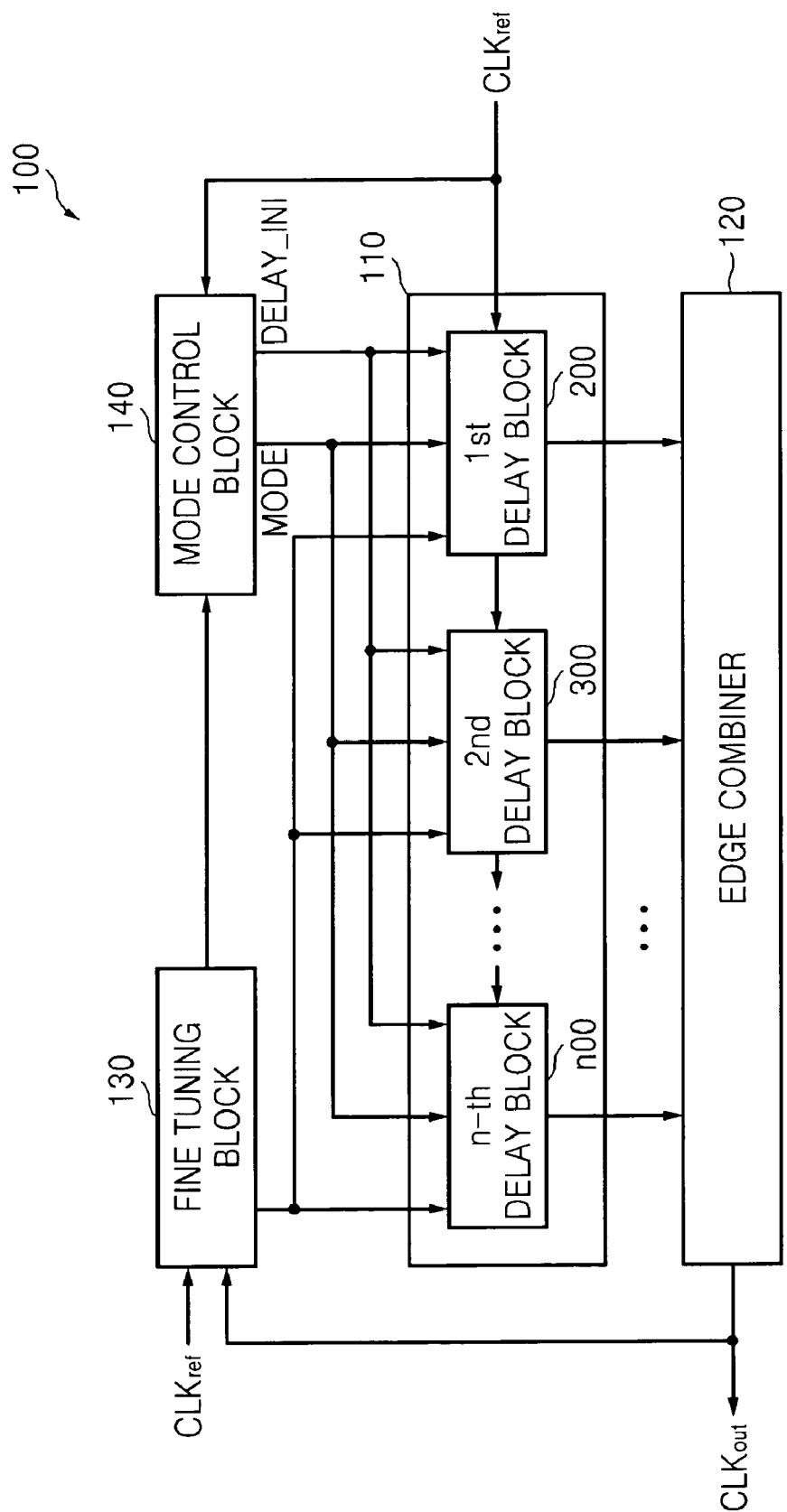
FIG. 1 is a block diagram of a delay locked loop (DLL) according to some embodiments of the present inventive concept.

The present inventive concept now will be described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this description will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the description.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a delay locked loop (DLL) 100 according to some embodiments of the present inventive concept. The DLL 100 includes a delay line 110, an edge combiner 120, a fine tuning block 130, and a mode control block 140.

The delay line 110 includes a plurality of delay blocks 200, 300, . . . , and n00. During a locking operation from the start of power supply to the DLL 100 until a particular period of time lapses, each of the delay blocks 200 through n00 operates as a ring oscillator which delays a reference clock signal $CLK_{ref}$ by a predetermined phase in response to a mode control signal MODE and an initial delay value DELAY_INI. The delay blocks 200 through n00 each independently performs an operation of delaying the reference clock signal $CLK_{ref}$ by the predetermined phase in response to the mode control signal MODE and the initial delay value DELAY_INI. However, during locking of an output clock signal $CLK_{out}$ since the particular time lapses from the start of the power supply, each of the delay blocks 200 through n00 operates as a phase delay line which controls the phase of the reference clock signal $CLK_{ref}$ or the phase of a signal output from a previous delay block in response to the mode control signal MODE.

The edge combiner 120 generates the output clock signal $CLK_{out}$ having a constant duty cycle and a frequency higher than the frequency of the reference clock signal $CLK_{ref}$ in response to output signals of the delay blocks 200 through n00.

The fine tuning block 130 controls the phase delay operation of the delay blocks 200 through n00 based on a phase difference between the reference clock signal $CLK_{ref}$ and the output clock signal $CLK_{out}$ and thereby controls the locking of the output clock signal $CLK_{out}$.

The mode control block 140 generates the mode control signal MODE and the initial delay value DELAY_INI based on the reference clock signal $CLK_{ref}$ and whether each of the delay blocks 200 through n00 has delayed the reference clock signal $CLK_{ref}$ by the predetermined phase.

The operation of the DLL 100 will be described in detail with reference to FIG. 2 below.

Figure 2:
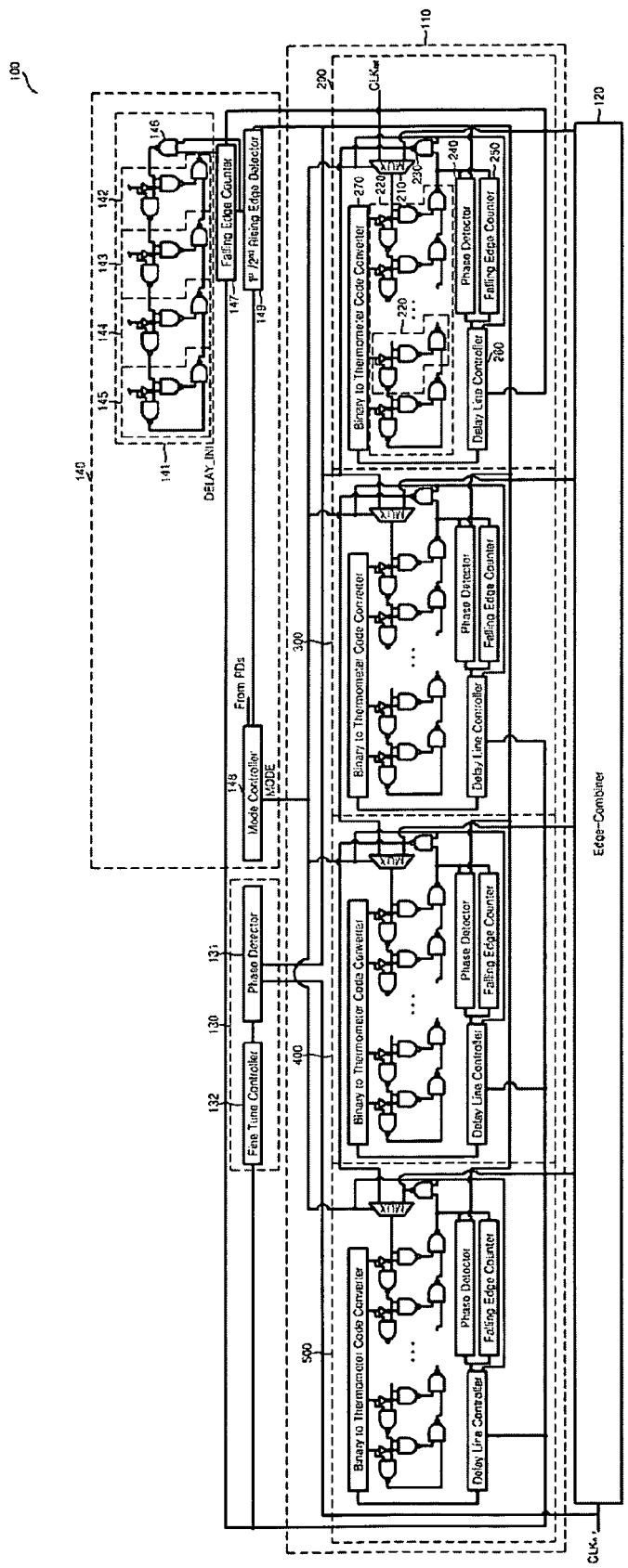
FIG. 2 is a circuit diagram of the DLL illustrated in FIG. 1 according to some embodiments of the present inventive concept.
Figure 4A:
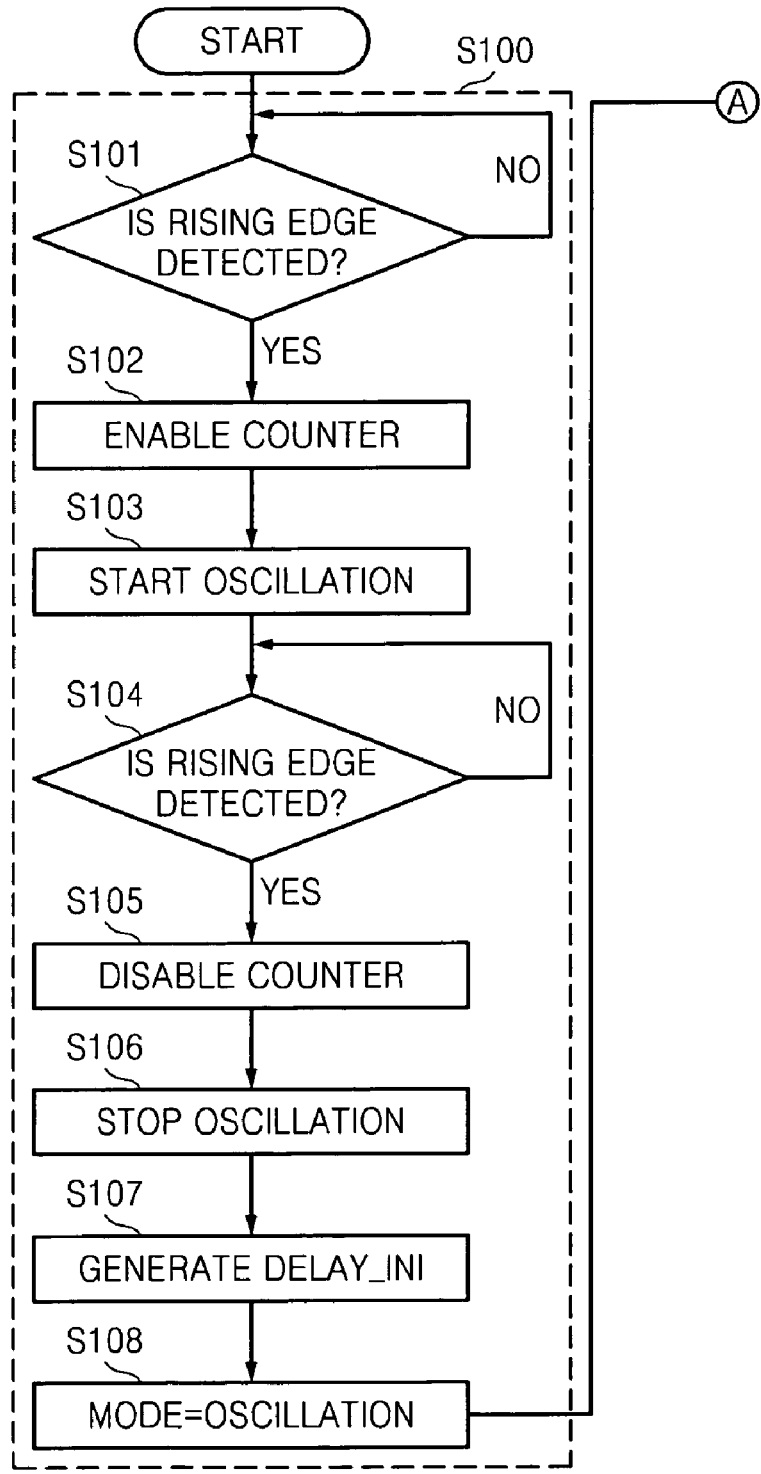
Figure 4C:
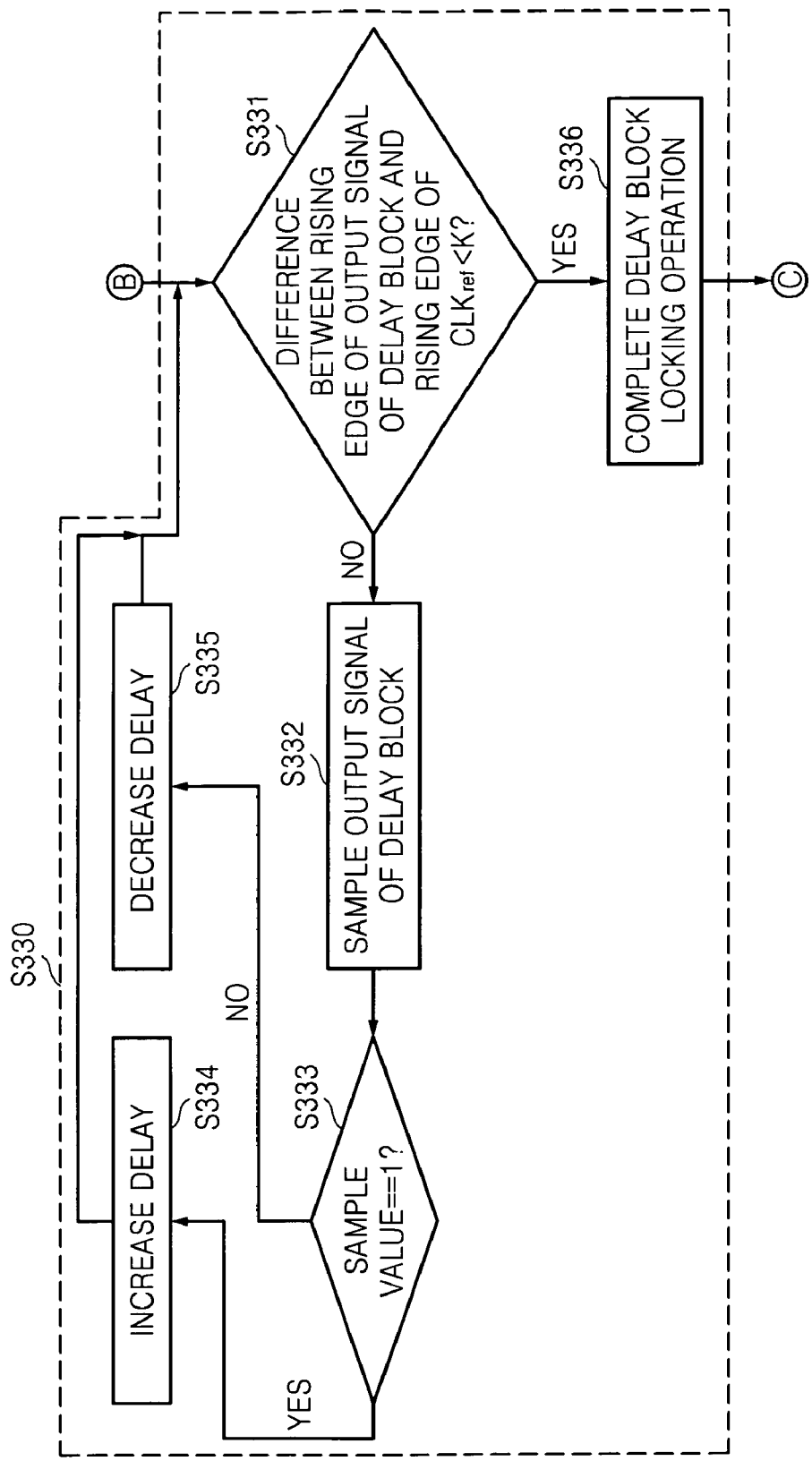
Figure 4D:
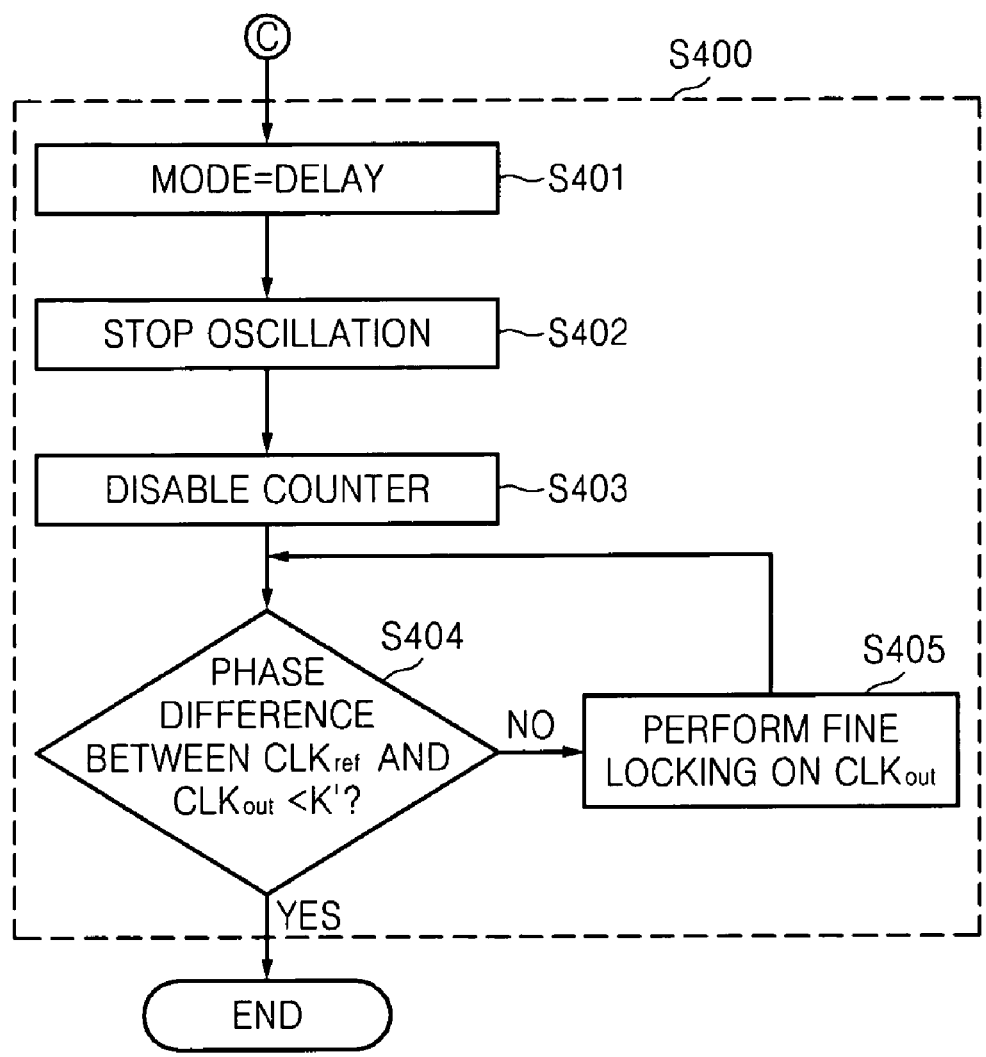

FIG. 2 is a circuit diagram of the DLL 100 illustrated in FIG. 1 according to some embodiments of the present inventive concept. Referring to FIG. 2, the DLL 100 generates the output clock signal $CLK_{out}$ having a frequency obtained by multiplying the frequency of the reference clock signal $CLK_{ref}$ by a multiplication factor of 2.

The mode control block 140 generates the mode control signal MODE and the initial delay value DELAY_INI based on the reference clock signal $CLK_{ref}$ and on whether each of the delay blocks 200, 300, 400, and 500 has delayed the phase of the reference clock signal $CLK_{ref}$ by 90 degrees. The mode control block 140 includes a ring oscillator 141, an edge counter 147, a mode controller 148, and a detector 149.

The ring oscillator 141 oscillates in response to the reference clock signal $CLK_{ref}$. The initial delay value DELAY_INI generated by the mode control block 140 is applied to the delay blocks 200 through 500 before the locking of the output clock signal $CLK_{out}$, so that the locking time of the DLL 100 is reduced and harmonic locking is prevented.

An oscillation frequency of the ring oscillator 141 may be set to a minimum oscillation frequency of the delay blocks 200 through 500. For instance, the oscillation frequency of the ring oscillator 141 may be set to a frequency that can be generated by each of the delay blocks 200 through 500 using a minimum ring. For clarity of the description, the ring oscillator 141 is implemented by a combination of a plurality of delay units 142, 143, 144, and 145 and a NAND gate 146. Each of the delay units 142 through 145 is implemented by a combination of a single inverter and three NAND gates. However, the present inventive concept is not restricted to the current embodiments.

Referring to FIG. 2, the ring oscillator 141 includes four delay units 142 through 145 and a single NAND gate 146 in order to generate the initial delay value DELAY_INI for delaying the phase of the reference clock signal $CLK_{ref}$ by 90 degrees. Although not shown, each of the delay units 142 through 145 may also include a fine delay unit. The fine delay unit may be implemented by a starved-current inverter, but the present inventive concept is not restricted thereto. The starved-current inverter is obvious to those of ordinary skill in the art and a detailed description thereof is thus omitted.

The amount of phase delay of the ring oscillator 141 can be finely changed by controlling the number of transistors that are turned on among transistors included in the starved current inverter. The fine delay unit may be connected between the NAND gate 146 and the delay units 142 through 145 or between two of the delay units 142 through 145.

The edge counter 147 counts the number of toggles of the ring oscillator 141 during a single period of the reference clock signal $CLK_{ref}$ to generate the initial delay value DELAY_INI. The edge counter 147 is implemented by a falling edge counter which counts falling edges of an output signal of the ring oscillator 141 in FIG. 2, but the present inventive concept is not restricted to the current embodiments.

The initial delay value DELAY_INI may be obtained by dividing a count result (or a counter value) of the edge counter 147 by the frequency-multiplication factor of the DLL 100. The initial delay value DELAY_INI is estimated such that the frequency of the output clock signal $CLK_{out}$ is approximate to a frequency obtained by multiplying the frequency of the reference clock signal $CLK_{ref}$ by the frequency-multiplication factor. Upon the start of the DLL 100, the initial delay value DELAY_INI estimated based on the multiplied frequency is applied to the delay blocks 200 through 500, and therefore, harmonic locking of the output clock signal $CLK_{out}$ is reduced as compared to conventional DLLs.

The mode controller 148 generates the mode control signal MODE based on whether each of the delay blocks 200 through 500 has delayed the reference clock signal $CLK_{ref}$ by a predetermined phase. For instance, the mode controller 148 may generate the mode control signal MODE for operating each of the delay blocks 200 through 500 as a ring oscillator until each of the delay blocks 200 through 500 completes a locking operation with respect to the predetermined phase. After the locking operation of each of the delay blocks 200 through 500 is completed, the mode controller 148 may generate the mode control signal MODE for operating each of the delay blocks 200 through 500 as a phase delay block. The mode controller 148 receives a signal indicating the completion of phase delay locking from a phase detector 240 included in each of the delay blocks 200 through 500.

The detector 149 detects a predetermined period of the reference clock signal $CLK_{ref}$ and controls the operation period of the ring oscillator 141 based on the detected period of the reference clock signal $CLK_{ref}$. Although the detector 149 is implemented by a rising edge detector which detects a rising edge of the reference clock signal $CLK_{ref}$ in FIG. 2, the present inventive concept is not restricted to the current embodiments.

The detector 149 may set a period between a first rising edge and a second rising edge of the reference clock signal $CLK_{ref}$ as the operation period of the ring oscillator 141. The edge counter 147 may generate the initial delay value DELAY_INI based on a result of counting edges of the output signal of the ring oscillator 141 during the period between the first and second rising edges of the reference clock signal $CLK_{ref}$.

The delay line 110 operates as a ring oscillator which delays the phase of the reference clock signal $CLK_{ref}$ by 90 degrees in response to the mode control signal MODE and the initial delay value DELAY_INI. The delay line 110 includes a plurality of the delay blocks 200 through 500 each operating as a phase delay line which controls the phase of the reference clock signal $CLK_{ref}$ or the phase of a signal output from a previous delay block 200, 300, or 400 in response to the mode control signal MODE.

The DLL 100 illustrated in FIG. 2 generates the output clock signal $CLK_{out}$ having a frequency two times higher than the frequency of the reference clock signal $CLK_{ref}$ using the delay blocks 200 through 500 each of which delays the phase of an input clock signal by 90 degrees. However, the scope of the present inventive concept is not restricted to the current embodiments. Each of the delay blocks 200 through 500 includes a selector 210, a phase delay unit block 220, a logic gate 230, a phase detector 240, an edge counter 250, and a delay line controller 260.

The selector 210 selectively outputs the reference clock signal $CLK_{ref}$ or an output signal of a previous delay block 200, 300, or 400 and an output signal (hereinafter, referred to as a feedback signal) of the current delay block 200, 300, 400, or 500, which has been fed back, based on the mode control signal MODE. For instance, when the delay line 110 operates as a ring oscillator, the selector 210 outputs the feedback signal, and yet, the selector 210 outputs the reference clock signal $CLK_{ref}$ at the beginning of the oscillation operation of each of the delay blocks 200 through 500. However, when the delay line 110 operates as a phase delay line, the selector 210 outputs the reference clock signal $CLK_{ref}$ or the output signal of the previous delay block 200, 300, or 400.

The phase delay unit block 220 includes a plurality of phase delay units 220' connected in series with each other and driven in response to a phase control signal. In the current embodiments of the present inventive concept, the phase delay unit block 220 includes a plurality of the phase delay units 220' each of which includes one inverter and three NAND gates, but the present inventive concept is not restricted to the current embodiments.

The logic gate 230 performs a logic operation on the mode control signal MODE and an output signal of the phase delay unit block 220 and outputs the output signal of the delay block 200, 300, 400, or 500. The logic gate 230 is implemented by a NAND gate operating a NAND operation on the output signal of the phase delay unit block 220 and the mode control signal MODE in the embodiments illustrated in FIG. 2, but the present inventive concept is not restricted thereto. The phase detector 240 detects and outputs a phase difference between the output signal of the phase delay unit block 220 and the reference clock signal $CLK_{ref}$.

Although not shown in FIG. 2, the phase delay unit block 220 may also include a fine delay unit (not shown). The fine delay unit may be implemented by a starved current inverter, but the present inventive concept is not restricted thereto. The amount of phase delay of the phase delay unit block 220 can be finely changed by controlling the number of transistors that are turned on among transistors included in the starved current inverter. The fine delay unit may be connected between the selector 210 and one of the phase delay units 220' or between two of the phase delay units 220' and may operate based on a code output from a code converter 270.

The edge counter 250 counts the number of toggles of the output signal of the phase delay unit block 220 during one period of the reference clock signal $CLK_{ref}$ and outputs a counter value. The edge counter 250 counts falling edges of the output signal of the phase delay unit block 220 in the embodiments illustrated in FIG. 2, but the present inventive concept is not restricted thereto. The edge counter 250 operates only when each of the delay blocks 200 through 500 operates as a ring oscillator, that is, while an independent locking operation is being performed on each of the delay blocks 200 through 500, but does not operate while a locking operation is performed on the output clock signal $CLK_{out}$.

The delay line controller 260 generates a phase control signal in response to the mode control signal MODE, the initial delay value DELAY_INI, an output signal of the phase detector 240, and an output signal of the edge counter 250. In detail, when the delay line 110 operates as a ring oscillator, the delay line controller 260 outputs the phase control signal based on the mode control signal MODE, the initial delay value DELAY_INI, and the counter value of the edge counter 250. When the delay line 110 operates as a phase delay line, the delay line controller 260 outputs the phase control signal based on the mode control signal MODE and the output signal of the phase detector 240.

The code converter 270 converts the phase control signal output from the delay line controller 260 into a code for controlling the driving of each phase delay unit 220'. The code converter 270 may be implemented by a binary-to-thermometer code converter which converts a binary phase control signal output from the delay line controller 260 into a thermometer code for determining whether to drive each phase delay unit 220' included in the phase delay unit block 220 as illustrated in FIG. 2, but the present inventive concept is not restricted thereto.

The edge combiner 120 detects an edge of the output signal of each of the delay blocks 200 through 500 after the delay blocks 200 through 500 complete the phase delay operation on the reference clock signal $CLK_{ref}$ and outputs the output clock signal $CLK_{out}$ having a frequency higher than that of the reference clock signal $CLK_{ref}$ based on the detected edges of the output signals of the delay blocks 200 through 500.

After the delay operation on the reference clock signal $CLK_{ref}$ is completed, the delay line 110 operates as a phase delay line and the delay blocks 200 through 500 output clock signals which have the same frequency as that of the reference clock signal $CLK_{ref}$ and have phases lagging that of the reference clock signal $CLK_{ref}$ by 90, 180, 270, and 360 degrees, respectively. The edge combiner 120 generates the output clock signal $CLK_{out}$ having a duty cycle of 50% and a frequency two times higher than that of the reference clock signal $CLK_{ref}$ in response to the output signals of the delay blocks 200 through 500. The edge combiner 120 may generate a clock signal toggling in response to a rising or falling edge of the output signal of each of the delay blocks 200 through 500.

Figure 6:
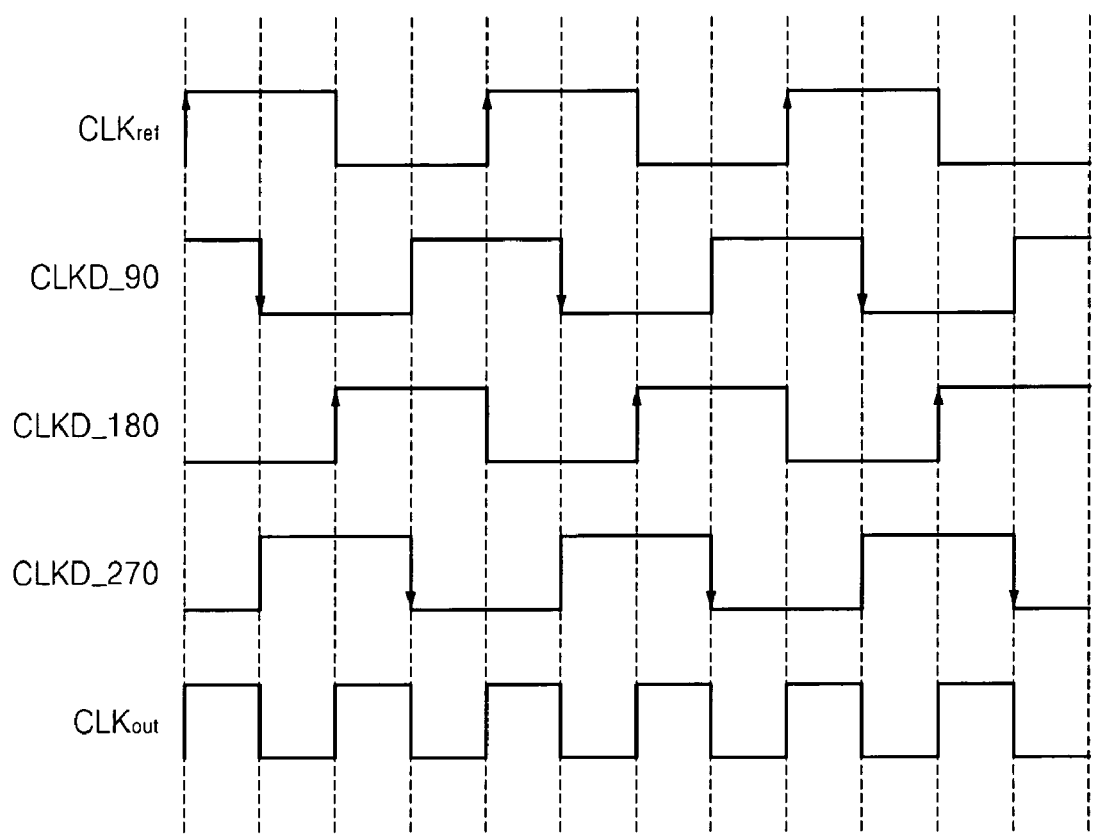
FIG. 6 is a timing chart of the operation of an edge combiner illustrated in FIG. 2.

FIG. 6 is a timing chart of the operation of the edge combiner 120 illustrated in FIG. 2. Referring to FIGS. 2 and 6, the edge combiner 120 receives clock signals CLKD_90, CLKD_180, CLKD_270, and $CLK_{ref}$ respectively having phases of 90, 180, 270, and 360 degrees, from the 90-degree delay blocks 200 through 500, respectively and generates the output clock signal $CLK_{out}$ toggling at each of falling edges of the 90- and 270-degree clock signals CLKD_90 and CLKD_270 and rising edges of the 180- and 360-degree clock signals CLKD_180 and $CLK_{ref}$, but the present inventive concept is not restricted thereto. The clock signal having a phase of 360 degrees is denoted by $CLK_{ref}$ in FIG. 6 since it has the same phase as that of the reference clock signal $CLK_{ref}$.

Consequently, the frequency of the output clock signal $CLK_{out}$ is two times higher than that of the reference clock signal $CLK_{ref}$. Also, the output clock signal $CLK_{out}$ has a constant duty cycle of 50% since even if the duty cycle of each of the clock signals CLKD_90, CLKD_180, CLKD_270, and $CLK_{ref}$, which have the same frequency as the reference clock signal $CLK_{ref}$ and have phases lagging that of the reference clock signal $CLK_{ref}$ by 90, 180, 270, and 360 degrees, respectively, is distorted, the rising or falling edges of the clock signals CLKD_90, CLKD_180, CLKD_270, and $CLK_{ref}$ occur at a constant interval.

When the output clock signal $CLK_{out}$ is generated using a system clock of a semiconductor memory device as the reference clock signal $CLK_{ref}$ and is used as a timing signal, a data transmission speed of the semiconductor memory device can be increased two times since the frequency of the timing signal increases and data transmission errors can be decreased due to the constant duty cycle of the timing signal. The DLL 100 multiplies the frequency of the reference clock signal $CLK_{ref}$ by two in the embodiments illustrated in FIGS. 2 and 6, but the present inventive concept is not restricted to these embodiments.

The fine tuning block 130 changes a phase delay of the delay blocks 200 through 500 based on a phase difference between the reference clock signal $CLK_{ref}$ and the output clock signal $CLK_{out}$ to control the locking operation on the output clock signal $CLK_{out}$. The fine tuning block 130 includes a phase detector 131 and a fine tune controller 132.

The phase detector 131 detects and outputs the phase difference between the reference clock signal $CLK_{ref}$ and the output clock signal $CLK_{out}$. The fine tuning block 130 operates in a mode in which the delay line 110 operates as a phase delay line. The fine tune controller 132 outputs a signal for controlling the operations of the phase delay units 220' to the delay line controller 260 in each of the delay blocks 200 through 500 based on the phase difference between the reference clock signal $CLK_{ref}$ and the output clock signal $CLK_{out}$.

FIG. 3 is a flowchart of a method of operating the DLL 100 illustrated in FIG. 2 according to some embodiments of the present inventive concept. Referring to FIGS. 1 through 3, upon power supply to the DLL 100, the mode control block 140 generates the initial delay value DELAY_INI for controlling the oscillation operation of the delay line 110 based on the reference clock signal $CLK_{ref}$ in operation S100.

Each of the delay blocks 200 through 500 in the delay line 110 starts the oscillation operation based on the initial delay value DELAY_WI in operation S200. After applying the initial delay value DELAY_INI to the delay blocks 200 through 500, the DLL 100 performs a locking operation to delay the reference clock signal $CLK_{ref}$ by a predetermined phase in operation S300. After the phase locking operation on the delay blocks 200 through 500 is completed, the delay line 110 performs a locking operation on the output clock signal $CLK_{out}$ in operation S400.

Figure 5:
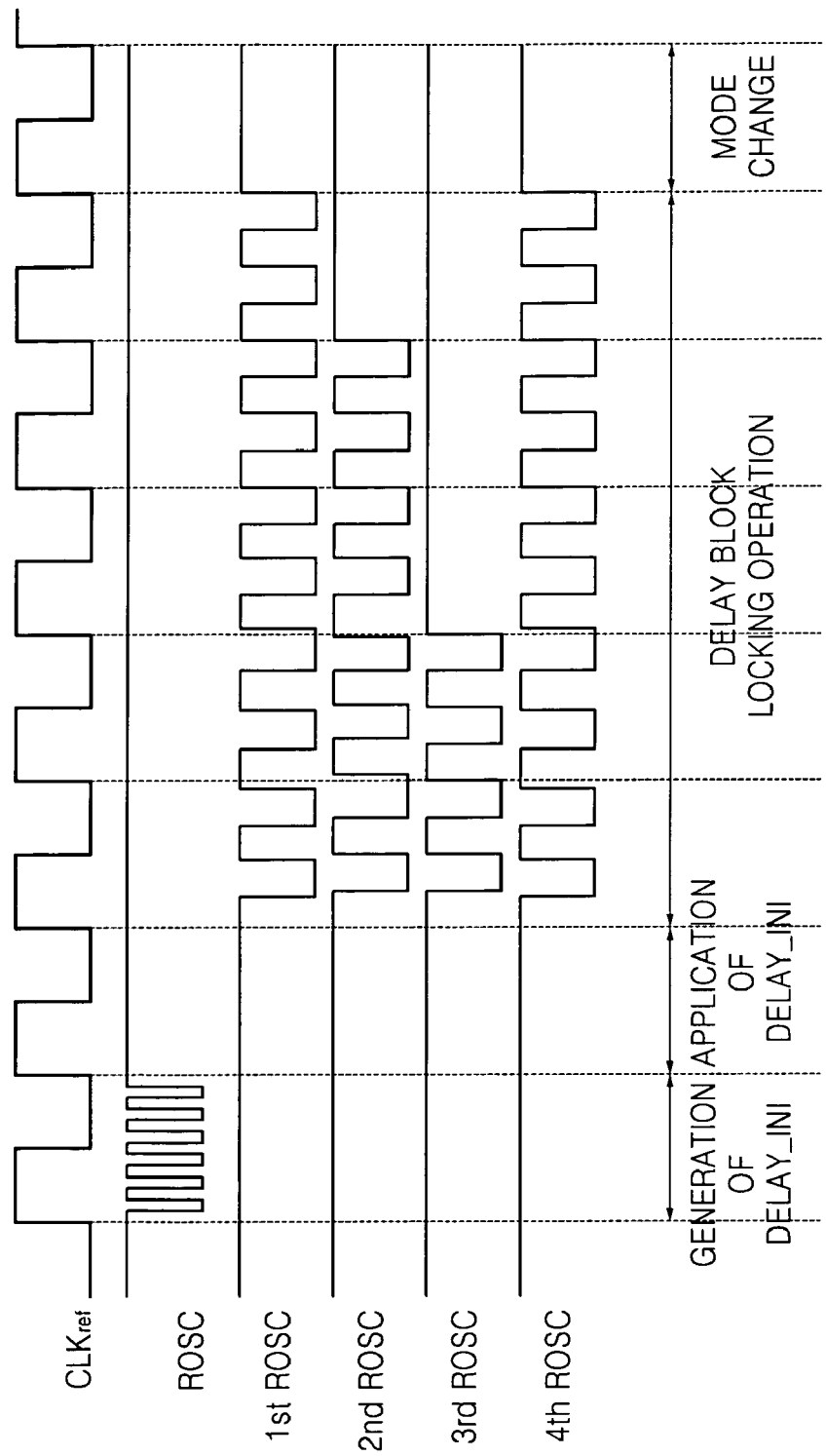
FIG. 5 is a timing chart of the operation of the DLL illustrated in FIG. 2.

FIGS. 4A through 4D contain a detailed flowchart of a method of operating the DLL 100 having a frequency two times higher than that of the reference clock signal $CLK_{ref}$. FIG. 5 is a timing chart of the operation of the DLL 100 in the method illustrated in FIGS. 4A through 4D. The method of operating the DLL 100 will be described in detail with reference to FIGS. 1 through 5 below.

Operation S100 in which the initial delay value DELAY_INI is generated may include the following operations. The edge detector 149 of the mode control block 140 detects a first rising edge of the reference clock signal $CLK_{ref}$ in operation S101. When the first rising edge of the reference clock signal $CLK_{ref}$ is detected, the edge counter 147 of the mode control block 140 starts counting falling edges of an output signal of the ring oscillator 141 in operation S102 and the ring oscillator 141 starts oscillation in operation S103. At this time, the oscillation frequency of the ring oscillator 141 is the same as the minimum oscillation frequency of the delay blocks 200 through 500. The edge detector 149 of the mode control block 140 detects a second rising edge of the reference clock signal $CLK_{ref}$ in operation S104. When the second rising edge of the reference clock signal $CLK_{ref}$ is detected, the edge counter 147 of the mode control block 140 stops counting the falling edges of the output signal of the ring oscillator 141 in operation S105 and the ring oscillator 141 stops the oscillation in operation S106. The mode control block 140 generates the initial delay value DELAY_INI for controlling an initial phase delay of the delay blocks 200 through 500 based on a counter value output from the edge counter 147 in operation S107. After generating the initial delay value DELAY_INI, the DLL 100 controls the delay blocks 200 through 500 to operate as ring oscillators in operation S108.

Referring to FIGS. 4 and 5, the output signal of the ring oscillator 141 has six falling edges during one period of the reference clock signal $CLK_{ref}$. Since a frequency-multiplication factor M of the frequency of the reference clock signal $CLK_{ref}$ is 2, the initial delay value DELAY_INI is 3 obtained by dividing the counter value of 6 from the edge counter 147 by the frequency-multiplication factor M of 2.

When the initial delay value DELAY_INI is applied in operation S200, the delay line controller 260 in each of the delay blocks 200 through 500 receives the initial delay value DELAY_INI of 3, converts the initial delay value DELAY_INI of 3 into a binary number of "11", and sends the binary number of "11" to the code converter 270. The code converter 270 converts the binary number of "11" into a thermometer code of "111" and then each of the delay blocks 200 through 500 drives three phase delay units 220'.

When the initial delay value DELAY_INI is applied to the delay blocks 200 through 500 in operation S200, each of the delay blocks 200 through 500 receives the reference clock signal $CLK_{ref}$ through the selector 210 and starts the oscillation operation. When the delay blocks 200 through 500 operate as ring oscillators, an output signal of each of the delay blocks 200 through 500 starts with a delay of a quarter period from the reference clock signal $CLK_{ref}$. That is, the phase of the output signal of each of the delay blocks 200 through 500 lags 90 degrees behind the phase of the reference clock signal $CLK_{ref}$. The frequency of the output signal of each of the delay blocks 200 through 500 is two times higher than that of the reference clock signal $CLK_{ref}$.

However, the output signals of the delay blocks 200 through 500 may have different phases due to process variation during manufacturing, which means that an error may occur in a phase delay value of 90 degrees when the delay blocks 200 through 500 operate as phase delay blocks. Accordingly, error compensation is required. After the initial delay value DELAY_INI is applied to the delay blocks 200 through 500 in operation S200, compensation of a phase delay error in each of the delay blocks 200 through 500 is performed in operation S300. Operation S300, in which the locking operation on the delay blocks 200 through 500 is performed, includes a coarse locking operation (S310) and a fine locking operation (S330).

The coarse locking operation (S310) on each of the delay blocks 200 through 500 includes the following operations. When the edge counter 250 is initialized (or reset) in operation S311, the reference clock signal $CLK_{ref}$ is applied to each of the delay blocks 200 through 500. The edge counter 250 detects a rising edge of an output signal generated by the phase delay unit block 220 based on the reference clock signal $CLK_{ref}$ in each of the delay blocks 200 through 500 in operation S312. At this time, the selector 210 in each of the delay blocks 200 through 500 outputs the reference clock signal $CLK_{ref}$ or the feedback signal of the current delay block 200, 300, 400 or 500 to the phase delay unit block 220.

When the rising edge is detected in operation S312, the edge counter 250 is enabled in operation S313 and each of the delay blocks 200 through 500 starts ring oscillation in operation S314. The edge counter 250 counts rising edges of the output signal of the phase delay unit block 220 during one period of the reference clock signal $CLK_{ref}$ in operation S315. The delay line controller 260 determines whether a counter value output from the edge counter 250 is 2 in operation S316.

The edge counter 250 counts the rising edges of the output signal of the phase delay unit block 220 during one period of the reference clock signal $CLK_{ref}$ in the embodiments illustrated in FIG. 4B, but the present inventive concept is not restricted to these embodiments. The edge counter 250 may be configured to count falling edges of the output signal of the phase delay unit block 220 during one period of the reference clock signal $CLK_{ref}$. Since the frequency of the output signal of the phase delay unit block 220 is double the frequency of the reference clock signal $CLK_{ref}$, the counter value of the edge counter 250 should be 2.

When it is determined that the counter value of the edge counter 250 is greater than 2 in operation S317, the number of phase delay units 220' performing the oscillation operation in each of the delay blocks 200 through 500 is decreased by 1 in operation S318 and then the oscillation of the delay blocks 200 through 500 ends in operation S320. When it is determined that the counter value of the edge counter 250 is less than 2 in operation S317, the number of phase delay units 220' performing the oscillation operation in each of the delay blocks 200 through 500 is increased by 1 in operation S319 and then the oscillation of the delay blocks 200 through 500 ends in operation S320.

During the coarse locking operation (S310) on each of the delay blocks 200 through 500, the DLL 100 repeats operations S311 through S320 until the counter value of the edge counter 250 becomes 2. When the counter value of the edge counter 250 is 2, each of the delay blocks 200 through 500 outputs a signal having a phase lagging 90 degrees behind the phase of the reference clock signal $CLK_{ref}$. However, the output signals of the delay blocks 200 through 500 may have a phase delay error due to process variation. Therefore, even when the counter value of the edge counter 250 is 2, the fine locking operation (S330) on each of the delay blocks 200 through 500 is performed as follows.

When it is determined that a difference between a rising edge of the output signal of each of the delay blocks 200 through 500 and a rising edge of the reference clock signal $CLK_{ref}$ is less than a predetermined value of K in operation S331, the locking operation on each of the delay blocks 200 through 500 is completed in operation S336. When it is determined that the phase difference between the two signals is greater than the predetermined value of K in operation S331, the phase detector 240 samples the output signal of each of the delay blocks 200 through 500 at a rising edge of the reference clock signal $CLK_{ref}$ in operation S332. When a sample value is a logic "1", the phase of the reference clock signal $CLK_{ref}$ leads the phase of the output signal of each of the delay blocks 200 through 500. Accordingly, the DLL 100 increases the amount of phase delay in each of the delay blocks 200 through 500 in operation S334. When the sample value is a logic "0", the phase of the reference clock signal $CLK_{ref}$ lags the phase of the output signal of each of the delay blocks 200 through 500. Accordingly, the DLL 100 decreases the amount of phase delay in each of the delay blocks 200 through 500 in operation S335. In each of the delay blocks 200 through 500, the amount of phase delay may be finely adjusted by controlling the number of transistors turned on in a starved current inverter operating as a fine delay unit. However, a method of finely adjusting the amount of phase delay is not restricted to the above-described one in the present inventive concept.

Referring to FIG. 5, output signals 1st ROSC, 2nd ROSC, 3rd ROSC, and 4th ROSC of the respective delay blocks 200 through 500 may have different phases and eventually have the same phase after the delay block locking operation is completed. In addition, the locking operation on each of the delay blocks 200 through 500 may be completed at a different time, which means that the locking operation on each of the delay blocks 200 through 500 may be performed independently.

After the delay block locking operation (S300) is completed, the DLL 100 performs a locking operation on the output clock signal $CLK_{out}$ in response to a delay block locking completion signal sent from each of the delay blocks 200 through 500 to the mode controller 148.

The locking operation (S400) performed by the DLL 100 on the output clock signal $CLK_{out}$ includes the following operations. When the delay block locking operation (S300) is completed, the DLL 100 controls the delay blocks 200 through 500 to operate as phase delay lines in operation S401, stops the ring oscillation operation of the delay blocks 200 through 500 in operation S402, and disables the edge counter 250 in operation S403. At this time, the selector 210 in each of the other delay blocks 300 through 500 except for the delay block 200 first receiving the reference clock signal $CLK_{ref}$ outputs the output signal of the previous delay block 200, 300, or 400. That is, each of the delay blocks 200 through 500 delays the phase of the reference clock signal $CLK_{ref}$ or the phase of a clock signal output from the previous delay block 200, 300, or 400 by 90 degrees. A procedure in which the edge combiner 120 combines the output signals of the delay blocks 200 through 500 to generate the output clock signal $CLK_{out}$ having a frequency two times higher than the frequency of the reference clock signal $CLK_{ref}$ has been described with reference to FIG. 6 above and a detailed description thereof will thus be omitted here.

The fine tune controller 132 determines whether a phase difference between the output clock signal $CLK_{out}$ and the reference clock signal $CLK_{ref}$, which has been detected by the phase detector 131 in the fine tuning block 130, is less than a predetermined value of K' in operation S404. When it is determined that the phase difference is less than the predetermined value of K', the whole locking operation of the DLL 100 ends. However, when it is determined that the phase difference is greater than the predetermined value of K', the DLL 100 performs a fine locking operation on the output clock signal $CLK_{out}$ in operation S405.

The fine locking operation on the output clock signal $CLK_{out}$ in a case where the phase of the output clock signal $CLK_{out}$ leads the phase of the reference clock signal $CLK_{ref}$ by at least the predetermined value of K' will be described below.

The fine tune controller 132 of the fine tuning block 130 generates a signal for delaying the phase of the output clock signal $CLK_{out}$ based on the phase difference detected by the phase detector 131. The delay line controller 260 in each of the delay blocks 200 through 500 generates and outputs a binary phase control signal for increasing the number of phase delay units 220' operating for phase delay in response to the signal output from the fine tune controller 132. At this time, the phase control signal may be set to be different for each of the delay blocks 200 through 500.

The code converter 270 converts the binary phase control signal received from the delay line controller 260 into a thermometer code. In response to the thermometer code, the number of phase delay units 220' that operate for the phase delay increases in each of the delay blocks 200 through 500, thereby delaying the phase of the output clock signal $CLK_{out}$.

When the phase difference between the output clock signal $CLK_{out}$ and the reference clock signal $CLK_{ref}$ is less than a value that can be controlled using the phase delay units 220', the amount of phase delay in each of the delay blocks 200 through 500 may be adjusted by controlling the number of transistors turned on in a starved current inverter operating as a fine delay unit. A method of controlling the amount of phase delay in the delay blocks 200 through 500 is not restricted to the above-described one in the present inventive concept. The above-described procedure is repeated until the phase difference between the output clock signal $CLK_{out}$ and the reference clock signal $CLK_{ref}$ becomes less than the predetermined value of K'.

The method of operating the DLL 100 according to some embodiments of the present inventive concept can also be embodied as computer readable codes on a computer readable recording medium. The computer readable recording medium is any data storage device that can store data which can be thereafter read by a computer system.

Figure 7:
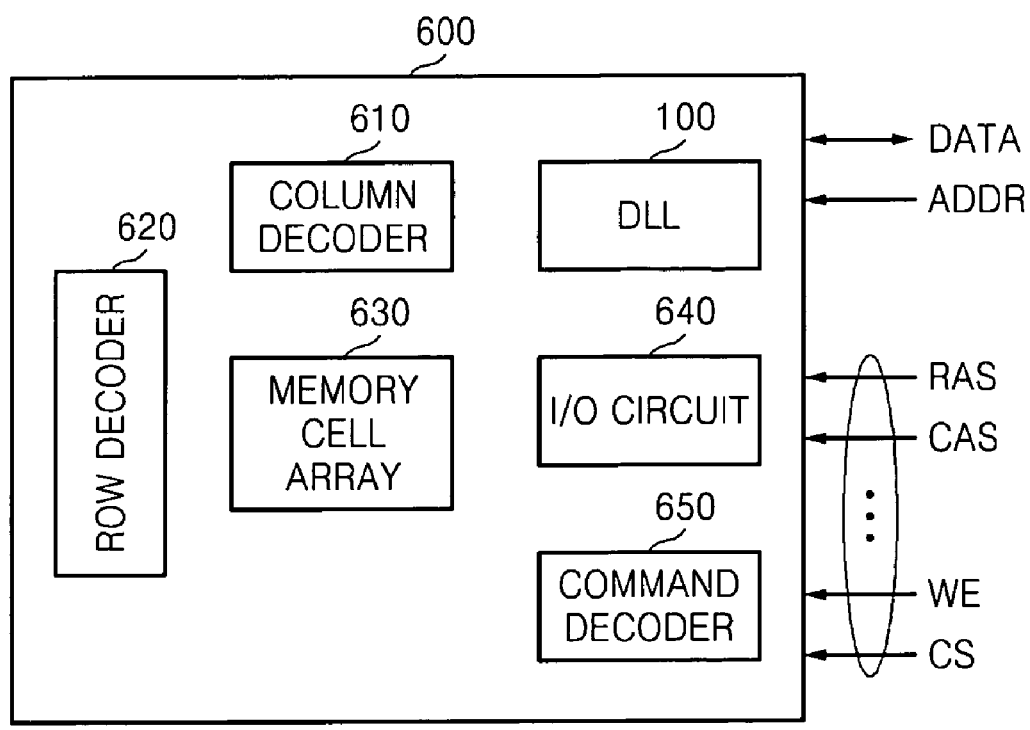
FIG. 7 is a block diagram of a semiconductor memory device according to some embodiments of the present inventive concept.

FIG. 7 is a block diagram of a semiconductor memory device 600 according to some embodiments of the present inventive concept. The semiconductor memory device 600 includes the DLL 100, a column decoder 610, a row decoder 620, a memory cell array 630, an input/output (I/O) circuit 640, and a command decoder 650.

The DLL 100 generates a timing signal needed to drive the semiconductor memory device 600, which has a frequency higher than a frequency of a system clock signal, using the system clock signal. The system clock signal and the timing signal respectively correspond to the reference clock signal $CLK_{ref}$ and the output clock signal $CLK_{out}$ in the DLL 100 illustrated in FIGS. 1 and 2. Since the DLL 100 has been described with reference to FIGS. 1 through 6, a detailed description of the DLL 100 will not be repeated and the characteristics of the semiconductor memory device 600 including the DLL 100 will be described here.

Since the semiconductor memory device 600 operates using the timing signal having a higher frequency than the system clock signal, it can perform high-speed data transmission and reception. In addition, the timing clock having a constant duty cycle is used, so that an error rate is low during the data transmission and reception.

The column decoder 610 and the row decoder 620 access a column and a row, respectively, in the memory cell array 630 in response to an address signal ADDR received through an address bus. The I/O circuit 640 receives data from an external device or transmits data to the external device through a data bus. The command decoder 650 receives external control signals RAS, CAS, WE, and CS and decodes the control signals RAS, CAS, WE, and CS to generate internal control signals.

The DLL 100 is used to generate the timing signal in the semiconductor memory device 600 in the embodiments illustrated in FIG. 7, but the use of the DLL 100 is not restricted to the current embodiments. It will be apparent to those of ordinary skill in the art that the DLL 100 according to some embodiments of the present inventive concept can be used in various types of electronic devices that use a clock signal generated based on a system clock signal or an external clock signal as a driving signal or a timing signal.

According to some embodiments of the present inventive concept, a DLL and an electronic device including the DLL are characterized by having a frequency higher than that of a reference clock signal and an accurate phase delay, generating clock signals having an accurate duty cycle, occupying a small area, and achieving fast locking.

While the present inventive concept has been particularly shown and described with reference to exemplary embodiments thereof, it will be understood by those of ordinary skill in the art that various changes in forms and details may be made therein without departing from the spirit and scope of the present inventive concept as defined by the following claims.

What is claimed is:

1. A delay locked loop comprising:
a delay line comprising a plurality of delay blocks each configured to operate as a ring oscillator, which delays a reference clock signal by a predetermined phase, in response to a mode control signal and an initial delay value and to operate as a phase delay line, which controls a phase of the reference clock signal or a phase of a signal output from a previous delay block among the plurality of delay blocks, in response to the mode control signal;
an edge combiner configured to generate an output clock signal having a constant duty cycle and a higher frequency than the reference clock signal in response to output signals of the delay blocks;
a fine tuning block configured to control the delay blocks based on a phase difference between the reference clock signal and the output clock signal to control a locking operation on the output clock signal; and a mode control block configured to generate the mode control signal and the initial delay value based on the reference clock signal and whether each of the delay blocks has delayed the reference clock signal by the predetermined phase.

2. The delay locked loop of claim 1, wherein the mode control block comprises:
   a ring oscillator configured to oscillate in response to the reference clock signal;
   an edge counter configured to generate the initial delay value based on a result of counting first edges of an output signal of the ring oscillator during one period of the reference clock signal; and
   a mode controller configured to generate the mode control signal based on whether each of the delay blocks has delayed the reference clock signal by the predetermined phase.

3. The delay locked loop of claim 2, wherein the mode control block further comprises a detector configured to detect a predetermined period of the reference clock signal and to control an operation period of the ring oscillator based on the detected period of the reference clock signal.

4. The delay locked loop of claim 1, wherein each of the delay blocks comprises:
   a selector configured to selectively output the reference clock signal or a feedback signal, which is an output signal of a current delay block among the plurality of delay blocks, or selectively output an output signal of the previous delay block or the feedback signal, based on the mode control signal;
   a phase delay unit block comprising a plurality of phase delay units connected in series and driven in response to a phase control signal;
   a logic gate configured to perform a logic operation on the mode control signal and an output signal of the phase delay unit block to generate an output signal of the delay block;
   a phase detector configured to detect and output a phase difference between the output signal of the phase delay unit block and the reference clock signal;
   an edge counter configured to count the number of toggles of the output signal of the phase delay unit block during one period of the reference clock signal and to output a counter value; and
   a delay line controller configured to generate the phase control signal in response to the mode control signal, the initial delay value, an output signal of the phase detector, an output signal of the edge counter, and an output signal of the fine tuning block.

5. The delay locked loop of claim 4, wherein the delay line controller generates the phase control signal based on the mode control signal, the initial delay value, and the counter value of the edge counter when the delay line operates as a ring oscillator and generates the phase control signal based on the mode control signal and the output signal of the phase detector when the delay line operates as a phase delay line.

6. The delay locked loop of claim 5, wherein each of the delay blocks further comprises a code converter configured to convert the phase control signal output from the delay line controller into a code for controlling an operation of each of the phase delay units.

7. The delay locked loop of claim 6, wherein the edge combiner detects an edge of an output signal of each of the delay blocks after each delay block completes delaying the reference clock signal and generates the output clock signal having the frequency higher than that of the reference clock signal based on detected edges of the output signals of the delay blocks.

8. The delay locked loop of claim 6, wherein the fine tuning block operates when the delay line operates as the phase delay line, and
   wherein the fine tuning block comprises
   a phase detector configured to detect and output the phase difference between the reference clock signal and the output clock signal; and
   a fine tune controller configured to output to the delay line controller a signal for controlling the phase delay units in each delay block based on the phase difference between the reference clock signal and the output clock signal.

9. A delay locked loop comprising:
   a delay line comprising four delay blocks each configured to operate as a ring oscillator, which delays a phase of a reference clock signal by 90 degrees, in response to a mode control signal and an initial delay value and to operate as a phase delay line, which controls the phase of the reference clock signal or a phase of a signal output from a previous delay block among the four delay blocks, in response to the mode control signal;
   an edge combiner configured to generate an output clock signal having a duty cycle of 50% and a frequency two times higher than a frequency of the reference clock signal in response to output signals of the four delay blocks;
   a fine tuning block configured to control the delay blocks based on a phase difference between the reference clock signal and the output clock signal to control a locking operation on the output clock signal; and
   a mode control block configured to generate the mode control signal and the initial delay value based on the reference clock signal and whether each of the delay blocks has delayed the phase of the reference clock signal by 90 degrees.

10. A method of operating a delay locked loop comprising:
    delaying a reference clock signal by a predetermined phase, in response to a mode control signal and an initial delay value, using a delay line comprising a plurality of delay blocks each configured to operate as a ring oscillator or controlling a phase of the reference clock signal or a phase of a signal output from a previous delay block among the plurality of delay blocks, in response to the mode control signal, using the delay blocks each configured to operate as a phase delay line;
    generating an output clock signal having a constant duty cycle and a higher frequency than the reference clock signal in response to output signals of the delay blocks using a edge combiner;
    controlling the delay blocks based on a phase difference between the reference clock signal and the output clock signal to control a locking operation on the output clock signal using a fine tuning block; and
    generating the mode control signal and the initial delay value based on the reference clock signal and whether each of the delay blocks has delayed the reference clock signal by the predetermined phase using a mode control block.

11. The method of claim 10, wherein the generating the mode control signal and the initial delay value based on the reference clock signal and whether each of the delay blocks has delayed the reference clock signal by the predetermined phase comprises:

oscillating a ring oscillator in response to the reference clock signal;

generating the initial delay value based on a result of counting first edges of an output signal of the ring oscillator during one period of the reference clock signal using an edge counter; and generating the mode control signal based on whether each of the delay blocks has delayed the reference clock signal by the predetermined phase in a mode controller.

12. The method of claim 11, wherein the generating the mode control signal and the initial delay value based on the reference clock signal and whether each of the delay blocks has delayed the reference clock signal by the predetermined phase further comprises detecting a predetermined period of the reference clock signal and to control an operation period of the ring oscillator based on the detected period of the reference clock signal using a detector.

13. The method of claim 10, wherein the delaying a reference clock signal by a predetermined phase, in response to a mode control signal and an initial delay value, using a delay line comprising a plurality of delay blocks each configured to operate as a ring oscillator or controlling a phase of the reference clock signal or a phase of a signal output from a previous delay block among the plurality of delay blocks, in response to the mode control signal, using the delay blocks each configured to operate as a phase delay comprises:

selectively outputting the reference clock signal or a feedback signal, which is an output signal of a current delay block among the plurality of delay blocks, or selectively outputting an output signal of the previous delay block or the feedback signal, based on the mode control signal using a selector;

delaying an output signal of the selector in response to a phase control signal using a phase delay unit block comprising a plurality of phase delay units connected in series and driven;

performing a logic operation on the mode control signal and an output signal of the phase delay unit block to generate an output signal of the delay block using a logic gate;

detecting and output a phase difference between the output signal of the phase delay unit block and the reference clock signal using a phase detector;

counting the number of toggles of the output signal of the phase delay unit block during one period of the reference clock signal and to output a counter value using an edge counter; and generating the phase control signal in response to the mode control signal, the initial delay value, an output signal of the phase detector, an output signal of the edge counter, and an output signal of the fine tuning block in a delay line controller.

14. The method of claim 13, wherein the delay line controller generates the phase control signal based on the mode control signal, the initial delay value, and the counter value of the edge counter when the delay line operates as a ring oscillator and generates the phase control signal based on the mode control signal and the output signal of the phase detector when the delay line operates as a phase delay line.

15. The method of claim 14, wherein each of the delay blocks further comprises a code converter configured to convert the phase control signal output from the delay line controller into a code for controlling an operation of each of the phase delay units.

16. The method of claim 15, wherein the edge combiner detects an edge of an output signal of each of the delay blocks after each delay block completes delaying the reference clock signal and generates the output clock signal having the frequency higher than that of the reference clock signal based on detected edges of the output signals of the delay blocks.

17. The method of claim 15, wherein the fine tuning block operates when the delay line operates as the phase delay line, and wherein the fine tuning block comprises a phase detector configured to detect and output the phase difference between the reference clock signal and the output clock signal; and a fine tune controller configured to output to the delay line controller a signal for controlling the phase delay units in each delay block based on the phase difference between the reference clock signal and the output clock signal.

* * * * *